United States Patent [19]

Purcell et al.

[11] Patent Number: 4,768,008
[45] Date of Patent: Aug. 30, 1988

[54] MRI MAGNET SYSTEM WITH VESSEL HAVING COMPOSITE FIRST WALL

[75] Inventors: John R. Purcell; Bruce C. Breneman, both of San Diego; Sibley C. Burnett, Cardiff, all of Calif.

[73] Assignee: General Atomics, San Diego, Calif.

[21] Appl. No.: 80,020

[22] Filed: Jul. 31, 1987

[51] Int. Cl.[4] .............................................. H01F 7/22
[52] U.S. Cl. ............................... 335/216; 174/15 CA; 324/318
[58] Field of Search ............................... 335/216, 299; 174/15 CA; 324/300, 318, 319, 320

[56] References Cited

U.S. PATENT DOCUMENTS

| | | | |
|---|---|---|---|
| 4,490,675 | 12/1984 | Knuettel et al. | 324/319 |
| 4,564,812 | 1/1986 | Van Dijk | 324/309 |
| 4,587,493 | 5/1986 | Sepponen | 324/319 |
| 4,587,504 | 5/1986 | Brown et al. | 335/216 |
| 4,599,592 | 7/1986 | Marsing | 335/216 |
| 4,613,820 | 9/1986 | Edelstein et al. | 324/318 |
| 4,613,926 | 9/1986 | Heitman et al. | 362/32 |
| 4,652,824 | 3/1987 | Oppelt | 324/318 |

Primary Examiner—George Harris
Attorney, Agent, or Firm—Fitch, Even, Tabin & Flannery

[57] ABSTRACT

A magnet system for use in magnetic resonance imaging. The system includes a vacuum vessel having a first wall assembly defining a bore for receiving the subject of the imaging and a pair of spaced metallic end plates welded to the ends of the first wall assembly. The system further includes a cryogenic containment vessel supported within the vacuum vessel and a coil disposed within the containment vessel for providing the magnetic field. The first wall assembly includes a weldable metallic cylindrical shell positioned intermediate the end plates and having a thickness insufficient without reinforcement to provide structural integrity during operation of the vacuum vessel. This first wall assembly further includes a reinforcement layer of a non-metallic material disposed about the metallic shell so that signals provided by gradient coils disposed inside the bore can more quickly penetrate the first wall assembly than if the metallic shell had sufficient thickness, without reinforcement to provide the necessary structural integrity.

11 Claims, 2 Drawing Sheets

MRI MAGNET SYSTEM WITH VESSEL HAVING COMPOSITE FIRST WALL

The present invention relates to apparatus for providing a magnetic field and, more particularly, to a magnetic resonance imaging (MRI) system including a vacuum vessel with improved electrical operating characteristics.

BACKGROUND OF THE INVENTION

One of the main areas of application for a magnet providing a region having a substantially homogeneous magnetic field with high flux density is in magnetic resonance imaging equipment. Such equipment when used for medical diagnosis provides information comparable to that provided by a computerized axial tomography scanner but without subjecting the patent undergoing examination to potentially harmful x-rays. Additionally, an MRI system offers other advantages over a computerized axial tomography scanner in that the operation of the former is not affected by the presence of bone. Ultimately the patient can safely remain in place long enough, and the MRI system can be designed to have sufficient resolution to allow observation of the body's take up of a drug.

MRI systems typically include a vacuum vessel containing a superconducting coil and a cryogenic system to maintain the coil below its critical temperature. The vacuum vessel defines a bore for receiving the subject of the imaging. Positioned inside the bore are gradient coils which are pulsed and function to determine spatial position in the imaging process. It is necessary that the signals generated by the gradient coils penetrate the first wall of the vacuum vessel (the cylindrical wall directly defining the bore and providing a vacuum/atmosphere interface).

An example of a vacuum vessel having a stainless steel first wall is shown in commonly-assigned allowed U.S. patent application Ser. No. 638,876, filed Aug. 8, 1984, the teachings of which are incorporaed herein by reference. This first wall is welded to stainless steel end plates. Eddy currents are generated by the signals from the gradient coils as they penetrate this wall which has a thickness of about 0.25 inch. The thicker the first wall, the longer the time required for penetration by the gradient fields. While this vessel performs satisfactorily, it is desirable to reduce the penetration time (make the first wall more "transparent" to the gradient field). Proposed fast imaging techniques include computer controlled pulse sequences which are increasingly complicated with sharper rise times approaching those of square waves.

Vacuum vessels are known which have fiberglass first walls. While such first walls are transparent to the gradient fields, they present reliability problems with respect to the vacuum sealing requirement because they cannot be welded to the end plates of the vacuum vessel and long term vacuum degradation due to diffusion may occur.

SUMMARY OF THE INVENTION

Among the various aspects and features of the present invention may be noted the provision of an improved vacuum vessel for an MRI magnet system. The vacuum vessel of the present invention provides structural integrity in that it includes a first wall assembly which is welded, and has a greatly reduced gradient field penetration time so that the vacuum vessel is better suited for use with high speed imaging techniques. The vacuum vessel is reliable in use, has long service life, and is relatively easy and economical to manufacture. Other aspects and features of the present invention will be, in part, apparent and, in part, pointed out hereinafter in the following specification and accompanying drawings.

Briefly, the magnet system of the present invention includes a vacuum vessel, a cryogenic containment vessel supported within the vacuum vessel and a coil positioned within the containment vessel for providing the magnetic field. The vacuum vessel has a first wall assembly defining a bore for receiving the subject of the imaging and a pair of spaced metallic end plates welded to the ends of the first wall assembly. The assembly has a weldable metallic cylindrical shell positioned intermediate the end plates and having a thickness insufficient, without reinforcement, to provide structural integrity during operation of the vacuum vessel. The assembly also includes a reinforcement layer of a non-metallic material about the metallic shell.

BRIEF DESCRIPTION OF THE DRAWINGS

Corresponding reference characters indicate corresponding components in FIGS. 2-4 of the drawings.

DESCRIPTION OF THE PREFERRED EMBODIMENT

Figure 2:
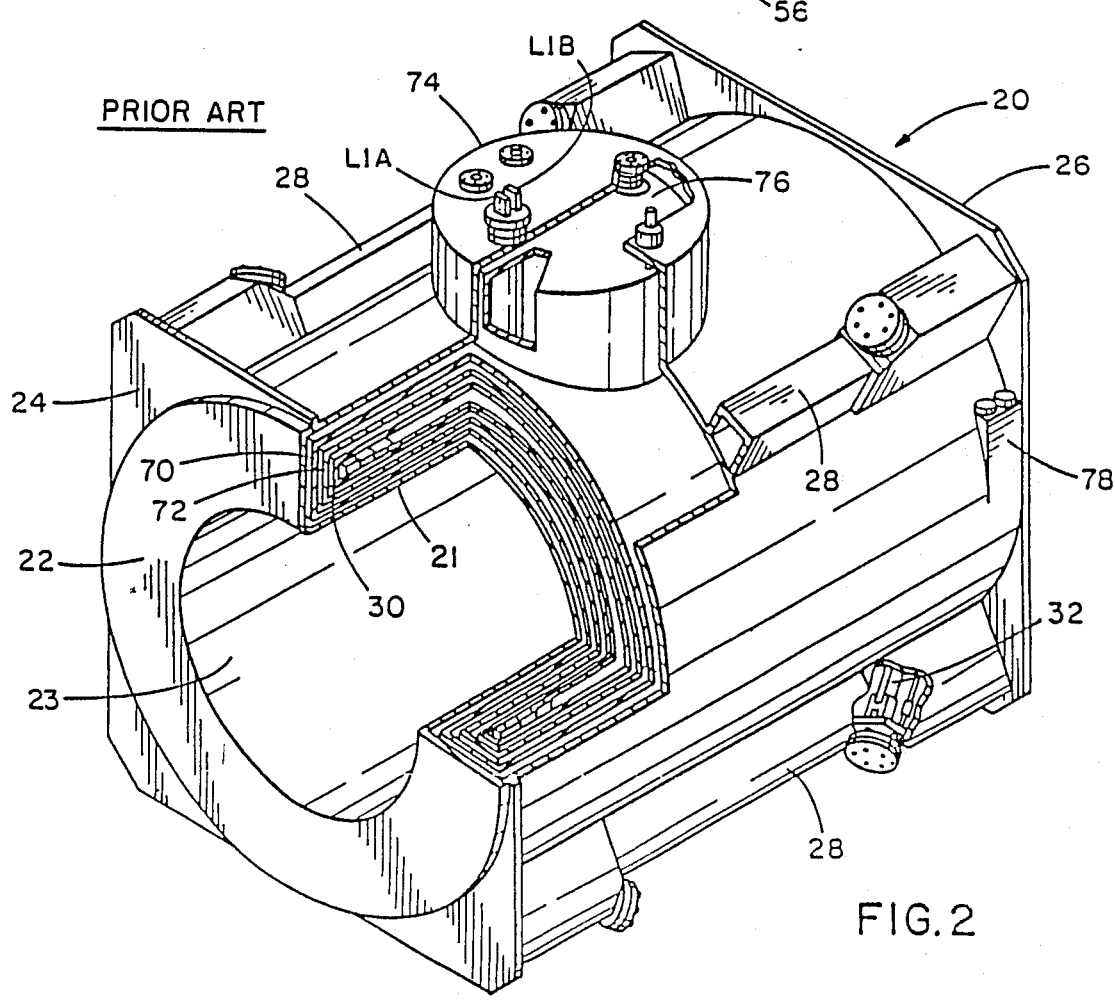
FIG. 2 is an isometric projection of a prior art MRI system magnet, including a vacuum vessel, with certain components removed to expose other components.
Figure 3:
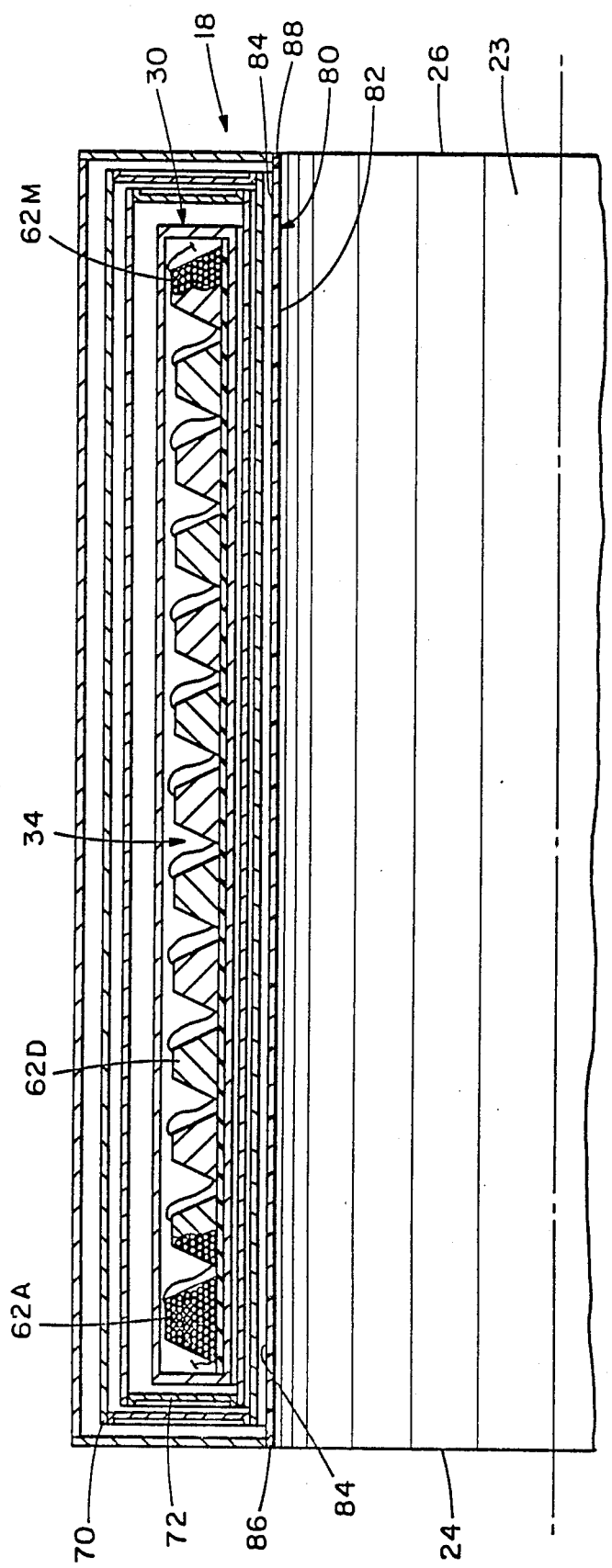
FIG. 3 is a cross-sectional view of the vacuum vessel of the present invention and the magnet components it encloses showing a first wall assembly, including a cylindrical metallic shell backed by a non-metallic reinforcement layer, which defines the bore of the magnet.

Referring now to the drawings, a vacuum vessel incorporating various features of the present invention is generally indicated by reference character 18 in FIG. 3. The vacuum vessel 18 is substantially identical to the prior art vacuum vessel 22 of the magnet system 20, shown in FIG. 2, except that the first wall 21 of the vessel 22 is made of a relatively thick (about 0.25 inch) stainless steel shell defining a bore 23 for receiving the subject (patient) of the imaging, while the vacuum vessel 18 has a first wall assembly 80 including a relatively thin metallic shell 82 directly defining the bore 23 and a non-metallic layer 84 reinforcing the shell 82. The magnet system 20 is the subject of U.S. patent application Ser. No. 638,876, filed Aug. 8, 1984. The length of the vacuum vessel may be from 7 to 9 feet.

Referring to FIG. 2, attached by welding to the vacuum vessel are end plates 24, 26 with regularly spaced beam-like reinforcements 28 extending axially to interconnect corresponding corners of the end plates. Supported inside the vacuum vessel is a substantially cylindrical cryogenic containment vessel 30. The vessel 30 is preferably supported by a series of straps 32 each of which is anchored by an enlarged end of a reinforcement 28. A preferred material for the straps is a fiberglass-epoxy composite which has sufficient strength characteristics to enable the magnet system to be sited in a vehicle. Each strap is provided with an adjustment mechanism to permit selective tensioning. Such adjustment mechanisms are well known to those of skill in the art and need not be further discussed here.

As best shown in FIG. 3, vacuum vessel 18 (as well as vessel 22) includes a single coil 34 disposed within the containment vessel for providing a localized, substantially homogeneous magnetic field within at least a portion of the bore 23. The coil is formed by tens of thousands of turns of superconductive wire, preferably having a diameter of between about 10 and 30 mils. The term "single coil" is to be accorded its broad meaning that the various turns of the coil are all in series so that the same current flows through all the turns. It will be appreciated that by using state of the art computer aided design/computer aided manufacturing techniques and equipment, very accurate location of each turn can be achieved. Thus, a single coil can be used to provide a localized area (at the center of the bore) of high field strength, at least 0.35 Tesla, and of sufficient homogeneity, the deviation in field strength being no more than 25 parts per million, for use in MRI. The coil 34 has a winding which may have a modular geometry including a plurality of axially-spaced wire groups or modules 62A–62M.

Figure 1:
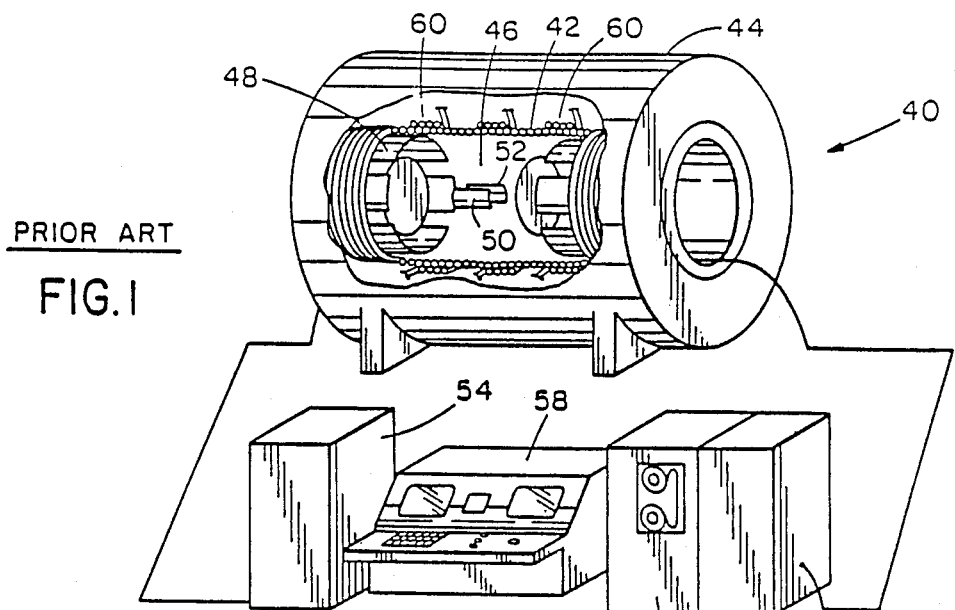
FIG. 1 is a simplified system diagram, partially block in nature, of a prior are MRI magnetic system.

The general operation of a typical MRI system is best discussed with reference to FIG. 1 which shows a prior art MRI system 40 including a superconducting magnet assembly having a winding 42 disposed within a cylindrical vacuum vessel 44 which also houses a cryogenic system. The vessel 44 defines a bore 46, which is at room temperature, and within which is supported gradient coils 48 that generate the relatively weak, rapidly changing magnetic field gradients needed for spatial definition. The system 40 also includes an RF coil (not shown) which may be located inside a gradient coil. The gradient coils are pulsed in sequence with the RF coil. Energy absorbed by the subject from the RF coil pulse causes hydrogen atoms to emit energy when the RF coil ceases signal emission. Placed at an inner location in the bore 46 is a radio frequency antenna formed by curved panels 50 and 52 which monitors the energy emitted by the hydrogen atoms. Shown interconnected with the superconducting magnet assembly are power supplies 54, data acquisition and processing equipment 56 and a display and control panel 58. For further information regarding MRI and the prior art apparatus for use in carrying out the imaging, reference may be made to the following:

(A) "Nuclear Magnet Resonance: WIP" by Crooks et al., *Radiology,* Vol. 143, pp. 169–174, April 1982.

(B) "Principles of NMR Imaging" by Pykett, et al., *Radiology,* Vol. 143, pp. 157–168, April 1982.

(C) "NMR Imaging in Medicine" by Ian L. Pykett, *Scientific American,* May 1982.

Referring to FIGS. 2 and 3, a magnet system including vacuum vessel 18 further includes a pair of thermal radiation shields 70, 72, which are disposed inside vessel 18 and contain the coil containment vessel 30. These radiation shields serve to reflect thermal energy from outside the vacuum vessel that would otherwise radiate to liquid helium which is included with the coil in the containment vessel 30. The tension members or straps 32, used to support the shields and the containment vessel 30 inside the vacuum vessel, are preferably of a fiberglass-epoxy construction, so as not to conduct heat well. Space between the various vessels and shields may contain so-called "superinsulation" formed of insulating material, such as aluminized polyester fiber, which further reduces the transmission of thermal energy to the liquid helium.

As shown in FIG. 2, mounted on the outer vacuum vessel 22 is an enclosure 74, housing a liquid nitrogen vessel 76, which also contains the necessary electrical switching equipment for controlling operation of the coil 34. Provided for by the enclosure are power leads L1A, L1B, liquid nitrogen boil-off and fill ports and a helium boil-off vent. The outer vacuum vessel 18 has an extension 78 for liquid helium cool-down and fill ports. The magnet system also contains the necessary plumbing to convey liquid helium and liquid nitrogen to their proper locations and to vent their gasses; however, such plumbing and related hardware are well known to those of skill in the art and not need be further discussed here. The walls of the containment vessel 30 as well as the walls of the vacuum vessel 22 are preferably fabricated of stainless steel while a preferable construction material for the radiation shields is an aluminum alloy. The coil may include approximately fifty thousand turns of small superconductive wire which could be energized sufficiently to provide a magnetic field strength of approximately 0.5 Tesla with a localized area of homogeneity including the center of the cavity having a deviation of less than 2 or 3 parts per million.

A shortcoming of vacuum vessel 22 with its relatively thick stainless steel first wall 21 is that while it provides a welded construction of sufficient structural integrity to withstand the internal pressure resulting from drawing a vacuum of approximately one atmosphere, it has a relatively high time constant for penetration by the gradient field. The shape of the gradient field with respect to time is critical in determining the sensitivity of the MRI system. The electrical coupling of the gradient field with the thermal shields 70 and 72 and the first wall 21 influences the shape of the gradient field pulses. Ideally, the first wall 21 is transparent to the gradient field (so that the spatial position in the imaging process can be reliably predetermined) while the thermal shields are opaque to the gradient fields (to prevent heating of the cryogenic containment vessel 30 due to generation of eddy currents).

The time constant of the first wall 21 is proportional to the ratio of $t/\rho$, where t=first wall thickness and $\rho$=first wall material electrical resistivity. A very short time constant results in the first wall being relatively transparent to the gradient field making a vacuum vessel suitable for use with fast imaging techniques with complicated pulse sequences involving very sharp pulse rise times. RF signals used for MRI are typically in the 1–100 MHz range. For example, the time constant for the relatively thick (0.25 inch) stainless steel first wall 21 of prior art vacuum vessel 22 is 2 milliseconds which limits the sensitivity of an MRI system incorporating the vessel 22.

Figure 4:
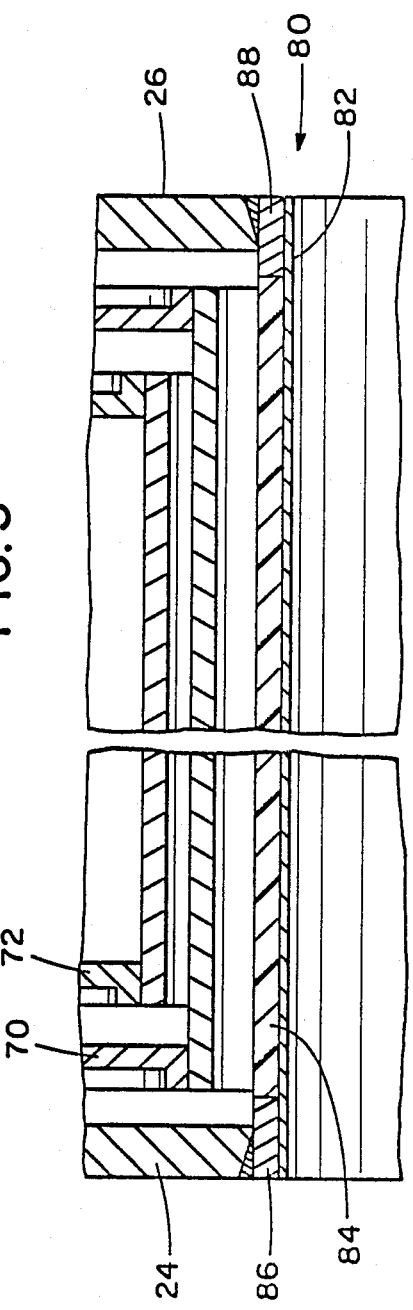
FIG. 4 is an enlargement of the first wall assembly.

Referring to FIGS. 3 and 4, the first wall assembly 80 of the present invention includes the relatively thin metallic shell 82 which has a wall thickness in the range of 0.020 inch to 0.050 inch, and is preferably about 0.024 inch thick. The assembly 80 further includes a pair of metallic reinforcing rings 86, 88 with one ring disposed at each end of the first wall assembly. As best shown in FIG. 4, the shell 82 is welded to the reinforcing rings 86, 88 which are in turn welded to their corresponding end plates 24, 26. This results in an all-welded vacuum seal, but one which, without reinforcement, does not provide the structural integrity necessary during operation of the vacuum vessel. That is, when a vacuum of approximately one atmosphere is drawn. However, the nonmetallic reinforcing layer 84 is used to back up the shell 82 to provide sufficient structural integrity during operation of the vacuum vessel. The layer 84 is preferably contiguous with the reinforcing rings 86, 88. As the layer 84 is essentially transparent to the gradient field, the layer can have the required thickness to provide the necessary support. The thickness of the end rings 86, 88 is also not critical as they are not in alignment with the coil 34 with respect to the centerline of the bore 23.

Thus, the vacuum vessel 18 has an all welded vacuum seal with a thin metallic shell and offers resistance to failure of the shell due to the internal pressure created by the vacuum as well as resistance to damage during fabrication of the first wall assembly, completion of the MRI system and use. For a stainless steel shell 82 having a thickness of 0.024 inch, a time constant of about 160 microseconds is achieved, making the vacuum vessel suitable for use with fast imaging techniques.

The preferred metallic materials for the shell 82 and the reinforcing rings 86, 88 are stainless steel or Inconel (a registered trademark of International Nickel Co. for corrosion-reistant, nickel-chromium alloys). The preferred materials for the reinforcing layer 84 are fiberglass and epoxy, although the layer could also be formed using carbon or silicon carbide fibers. As will be apparent to those of skill in the art, the layer 84 can either be wound about the shell 82, or it could be formed separately and then telescoped about the shell.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A magnet system for providing a localized, substantially homogeneous magnetic field for use in magnetic resonance imaging, said magnet system comprising:
   a vacuum vessel including a first wall assembly defining a bore for receiving the subject of the imaging and a pair of spaced metallic end plates welded to the ends of said first wall assembly;
   a cryogenic containment vessel supported within said vacuum vessel; and
   a coil disposed within said containment vessel for providing said magnetic field, said first wall assembly including a weldable metallic cylindrical shell disposed intermediate said end plates and having a thickness insufficient, without reinforcement, to provide structural integrity during operation of said vacuum vessel, said first wall assembly further including a reinforcement layer of a non-metallic material disposed about said metallic shell, whereby signals provided by gradient coils disposed inside said bore can more quickly penetrate said first wall assembly than if said metallic shell had sufficient thickness, without reinforcement, to provide said structural integrity.

2. A magnet system as set forth in claim 1 wherein said first wall assembly further comprises a pair of metallic reinforcing rings with one ring disposed at each end of said first wall assembly, said shell being welded to said rings and said rings being welded to said end plates.

3. A magnet system as set forth in claim 2 wherein said reinforcing rings are not in alignment with said coil with respect to the centerline of said bore.

4. A magnet system as set forth in claim 1 wherein the wall thickness of said metallic shell is in the range of 0.020 inch to 0.050 inch.

5. A magnet system as set forth in claim 1 wherein said metallic shell is formed of stainless steel.

6. A magnet system as set forth in claim 1 wherein said metallic shell is formed of a nickel-chromium alloy.

7. A magnet system as set forth in claim 1 wherein said reinforcement layer is formed of fiberglass and epoxy.

8. A magnet system as set forth in claim 1 wherein said reinforcement layer includes carbon.

9. A magnet system as set forth in claim 1 wherein said reinforcement layer includes silicon carbide fibers.

10. A magnet system as set forth in claim 2 wherein said reinforcement layer is contiguous with said rings.

11. An improvement in a magnet system for providing a localized, substantially homogeneous magnetic field for use in magnetic resonance imaging, said magnet system comprising:
    a vacuum vessel defining a bore for receiving the subject of the imaging and including a pair of spaced metallic end plates;
    a cryogenic containment vessel supported within the vacuum vessel;
    a coil disposed within said containment vessel for providing said magnetic field; and
    a gradient coil disposed inside said bore for pulsed operation at radio frequency, said improvement comprising:
    a first wall assembly in said vacuum vessel and welded to said end plates, said assembly including a weldable metallic cylindrical shell defining said bore and disposed intermediate said end plates, said shell having a wall thickness in the range of 0.020 inch to 0.050 inch;
    a pair of metallic reinforcing rings with one ring disposed at each end of said assembly, said shell being welded to said rings and said rings being welded to said end plates; and
    a reinforcement layer of non-metallic material disposed about said metallic shield.

* * * * *

UNITED STATES PATENT AND TRADEMARK OFFICE
CERTIFICATE OF CORRECTION

PATENT NO.   :  4,768,008
DATED        :  August 30, 1988
INVENTOR(S)  :  John R. Purcell et al.

It is certified that error appears in the above-identified patent and that said Letters Patent is hereby corrected as shown below:

Column 1, line 41, change "incorporaed" to --incorporated--.

Column 2, line 25, change "are" to --art--.

Column 3, line 50, change "Radioloqy" to --Radiology--.

Column 5, line 23, change "corrosion-reistant" to
    --corrosion-resistant--.

Signed and Sealed this

Twenty-fourth Day of January, 1989

Attest:

DONALD J. QUIGG

*Attesting Officer*     *Commissioner of Patents and Trademarks*